US009537618B2

(12) United States Patent
Lambert et al.

(10) Patent No.: US 9,537,618 B2
(45) Date of Patent: Jan. 3, 2017

(54) SYSTEMS AND METHODS FOR DIFFERENTIAL PAIR IN-PAIR SKEW DETERMINATION AND COMPENSATION

(71) Applicant: Dell Products L.P., Round Rock, TX (US)

(72) Inventors: Timothy M. Lambert, Austin, TX (US); Bhavesh Govindbhai Patel, Austin, TX (US); Bhyrav M. Mutnury, Round Rock, TX (US)

(73) Assignee: Dell Products L.P., Round Rock, TX (US)

( * ) Notice: Subject to any disclaimer, the term of this patent is extended or adjusted under 35 U.S.C. 154(b) by 147 days.

(21) Appl. No.: 13/720,283

(22) Filed: Dec. 19, 2012

(65) Prior Publication Data

US 2014/0173367 A1     Jun. 19, 2014

(51) Int. Cl.
| | |
|---|---|
| G06F 11/07 | (2006.01) |
| H04L 1/24 | (2006.01) |
| G01R 31/317 | (2006.01) |
| H04L 25/02 | (2006.01) |

(52) U.S. Cl.
CPC ......... H04L 1/244 (2013.01); G01R 31/31706 (2013.01); H04L 25/0272 (2013.01); G01R 31/31725 (2013.01)

(58) Field of Classification Search
CPC ................... G01R 31/31937; G01R 31/31725; G01R 31/31922; H04L 25/14; H04L 1/244; H04L 1/00; H04L 25/0272; G11B 20/20; G06F 11/0751
USPC ........................................................ 714/700
See application file for complete search history.

(56) References Cited

U.S. PATENT DOCUMENTS

| | | | |
|---|---|---|---|
| 7,085,337 B2 | 8/2006 | Dyer et al. | |
| 7,586,987 B2 | 9/2009 | Vorenkamp et al. | |
| 8,305,113 B1 | 11/2012 | Payne | |
| 2004/0091064 A1 | 5/2004 | Cao et al. | |
| 2005/0099216 A1* | 5/2005 | Dyer et al. | 327/165 |

(Continued)

OTHER PUBLICATIONS

International Search Report and Written Opinion, mailed Dec. 20, 2013, International Patent Application No. PCT/US13/47000, 7 pages.

(Continued)

*Primary Examiner* — Albert Decady
*Assistant Examiner* — Kyle Vallecillo
(74) *Attorney, Agent, or Firm* — Jackson Walker L.L.P.

(57) ABSTRACT

In accordance with embodiments of the present disclosure, an information handling system may include a processor, a first information handling resource communicatively coupled to the processor, and a second information handling resource communicatively coupled to the processor and the first information handling resource. The first information handling resource and the second information handling resource may be configured to, in concert determine an optimum delay between opposite polarity signals for differential signals communicated from the first information handling resource to the second information handling resource via a path comprising a differential pair and transmit data from the first information handling resource to the second information handling resource via the path by inserting a delay into one of the opposite polarity signals equal to the optimum delay.

14 Claims, 2 Drawing Sheets

(56) References Cited

U.S. PATENT DOCUMENTS

| | | | |
|---|---|---|---|
| 2006/0182215 A1* | 8/2006 | Dreps | H03K 5/133 375/372 |
| 2006/0193395 A1* | 8/2006 | Ferraiolo | H04L 7/10 375/265 |
| 2006/0244505 A1 | 11/2006 | Fung et al. | |
| 2006/0256880 A1 | 11/2006 | Frisch | |
| 2008/0297216 A1* | 12/2008 | Chiang et al. | 327/158 |
| 2009/0153213 A1* | 6/2009 | Jia et al. | 327/261 |
| 2009/0174448 A1 | 7/2009 | Zabinski | |
| 2010/0014569 A1* | 1/2010 | Cases | H04L 43/50 375/224 |
| 2010/0135654 A1* | 6/2010 | Pincemin et al. | 398/25 |
| 2010/0272216 A1* | 10/2010 | Liebowitz et al. | 375/316 |
| 2010/0293410 A1* | 11/2010 | Bland | G11C 29/88 714/6.13 |
| 2010/0295591 A1 | 11/2010 | Asmanis et al. | |
| 2011/0075761 A1* | 3/2011 | Kuwata | 375/296 |
| 2012/0155527 A1 | 6/2012 | Gruendler et al. | |

OTHER PUBLICATIONS

Extended European Search Report, European Patent Application No. 13866260.6, mailed Jul. 5, 2016, 10 pages.

\* cited by examiner

SYSTEMS AND METHODS FOR DIFFERENTIAL PAIR IN-PAIR SKEW DETERMINATION AND COMPENSATION

TECHNICAL FIELD

The present disclosure relates in general to information handling systems, and more particularly to skew determination and compensation in communications paths in information handling systems.

BACKGROUND

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Various components of information handling systems often employ differential signaling. Differential signaling is a method of transmitting information electrically with two complementary signals sent on two paired electrical conductors (e.g., wires, electrical traces, etc.), called a differential pair. Due to any number of factors, differential signals in a differential pair may suffer from in-pair skew, in which the differential signals may be out of phase with respect to one another, switching at slightly different times rather than simultaneously, as would be the ideal case. At sufficiently low communication speeds or data rates, effects of in-pair skew may be ignored. However, at higher speeds or data rates, in-pair skew may become problematic. For example, consider a communications path in which 15 picoseconds of in-pair skew is present. In a 1 Gigabit-per-second communication path, such in-pair skew equals a relatively low 1.5 percent of the data rate. However, in a 40 Gigabit-per-second communication path, such in-pair skew accounts for 60 percent of the data rate, and thus cannot be ignored.

Many design and process approaches have been employed to reduce in-pair skew. However, such approaches are not able to eliminate all sources of in-pair skew. For example, in-pair skew may be introduced by various process tolerances, including without limitation the fiberglass weave of printed circuit boards in which components may be installed, integrated circuit chip mismatches, printed circuit board wiring mismatches, connector pin mismatches, and other process mismatches of signal transmitter and/or receiver components.

SUMMARY

In accordance with the teachings of the present disclosure, the disadvantages and problems associated with skew determination and/or compensation have been reduced or eliminated.

In accordance with embodiments of the present disclosure, an information handling system may include a processor, a first information handling resource communicatively coupled to the processor, and a second information handling resource communicatively coupled to the processor and the first information handling resource. The first information handling resource and the second information handling resource may be configured to, in concert determine an optimum delay between opposite polarity signals for differential signals communicated from the first information handling resource to the second information handling resource via a path comprising a differential pair and transmit data from the first information handling resource to the second information handling resource via the path by inserting a delay into one of the opposite polarity signals equal to the optimum delay.

In accordance with these and other embodiments of the present disclosure a method may include determining an optimum delay between opposite polarity signals for differential signals communicated from a first information handling resource to a second information handling resource via a path comprising a differential pair. The method may further include transmitting data from the first information handling resource to the second information handling resource via the path by inserting a delay into one of the opposite polarity signals equal to the optimum delay.

In accordance with these and other embodiments of the present disclosure, an article of manufacture may include a computer readable medium and computer-executable instructions carried on the computer readable medium. The instructions may be readable by one or more processors, the instructions, when read and executed, for causing the one or more processors to determine an optimum delay between opposite polarity signals for differential signals communicated from a first information handling resource to a second information handling resource via a path comprising a differential pair and transmit data from the first information handling resource to the second information handling resource via the path by inserting a delay into one of the opposite polarity signals equal to the optimum delay.

Technical advantages will be apparent to those of ordinary skill in the art in view of the following specification, claims, and drawings.

BRIEF DESCRIPTION OF THE DRAWINGS

A more complete understanding of the present embodiments and advantages thereof may be acquired by referring to the following description taken in conjunction with the accompanying drawings, in which like reference numbers indicate like features, and wherein.

DETAILED DESCRIPTION

Figure 1:
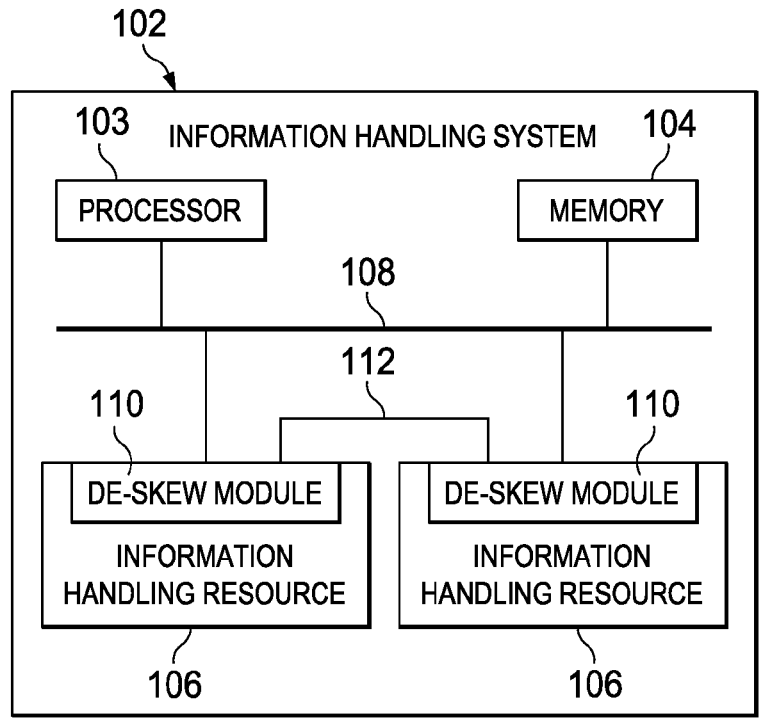
FIG. 1 illustrates a block diagram of an example information handling system, in accordance with embodiments of the present disclosure.
Figure 3:
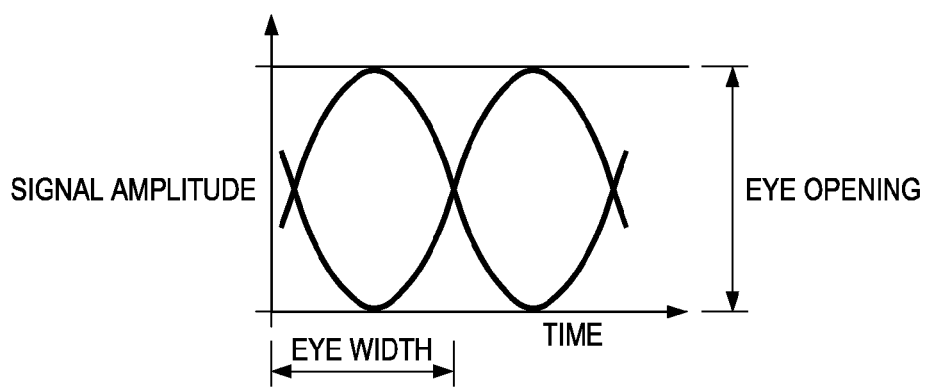
FIG. 3 illustrates an example plot of signal amplitude versus time which demonstrates an eye pattern for a differential signal pair, in accordance with embodiments of the present disclosure.
Figure 2:
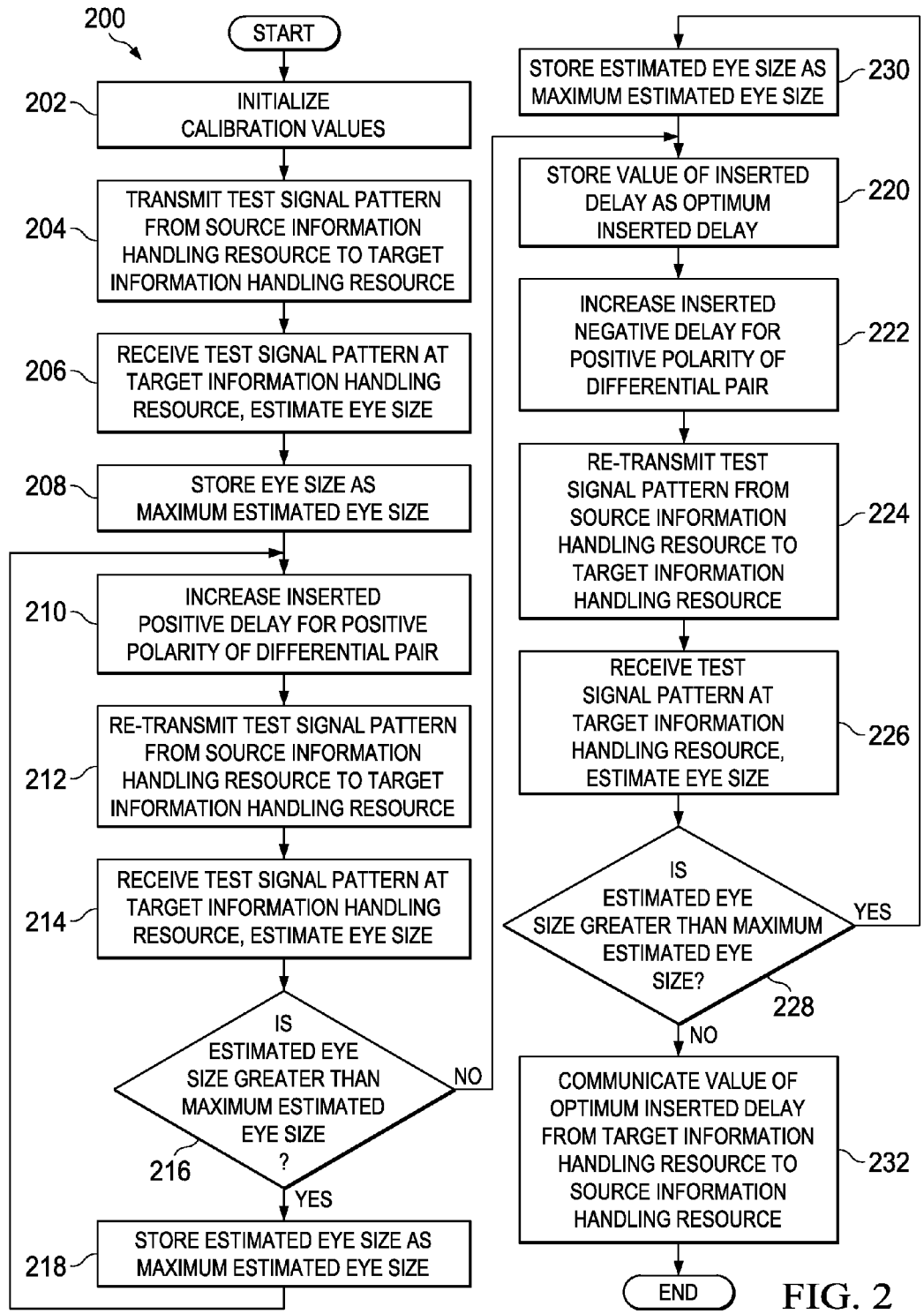
FIG. 2 illustrates a flow chart of an example method for in-pair skew determination and compensation, in accordance with embodiments of the present disclosure.

Preferred embodiments and their advantages are best understood by reference to FIGS. 1-3, wherein like numbers are used to indicate like and corresponding parts.

For the purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, an information handling system may be a personal computer, a personal data assistant (PDA), a consumer electronic device, a network storage device, or any other suitable device and may vary in size, shape, performance, functionality, and price. The information handling system may include memory, one or more processing resources such as a central processing unit (CPU) or hardware or software control logic. Additional components or the information handling system may include one or more storage devices, one or more communications ports for communicating with external devices as well as various input and output (I/O) devices, such as a keyboard, a mouse, and a video display. The information handling system may also include one or more buses operable to transmit communication between the various hardware components.

For the purposes of this disclosure, computer-readable media may include any instrumentality or aggregation of instrumentalities that may retain data and/or instructions for a period of time. Computer-readable media may include, without limitation, storage media such as a direct access storage device (e.g., a hard disk drive or floppy disk), a sequential access storage device (e.g., a tape disk drive), compact disk, CD-ROM, DVD, random access memory (RAM), read-only memory (ROM), electrically erasable programmable read-only memory (EEPROM), and/or flash memory; as well as communications media such as wires, optical fibers, microwaves, radio waves, and other electromagnetic and/or optical carriers; and/or any combination of the foregoing.

For the purposes of this disclosure, information handling resources may broadly refer to any component system, device or apparatus of an information handling system, including without limitation processors, service processors, basic input/output systems (BIOSs), busses, memories, I/O devices and/or interfaces, storage resources, network interfaces, motherboards, and/or any other components and/or elements of an information handling system.

FIG. 1 illustrates a block diagram of an example information handling system 102, in accordance with embodiments of the present disclosure. In some embodiments, information handling system 102 may be a server. In other embodiments, information handling system 102 may be a personal computer (e.g., a desktop computer or a portable computer). As depicted in FIG. 1, information handling system 102 may include a processor 103, a memory 104 communicatively coupled to processor 103, and one or more information handling resources 106 communicatively coupled to processor 103 via a bus 108.

Processor 103 may include any system, device, or apparatus configured to interpret and/or execute program instructions and/or process data, and may include, without limitation, a microprocessor, microcontroller, digital signal processor (DSP), application specific integrated circuit (ASIC), or any other digital or analog circuitry configured to interpret and/or execute program instructions and/or process data. In some embodiments, processor 103 may interpret and/or execute program instructions and/or process data stored in memory 104 and/or another component of information handling system 102.

Memory 104 may be communicatively coupled to processor 103 and may include any system, device, or apparatus configured to retain program instructions and/or data for a period of time (e.g., computer-readable media). Memory 104 may include RAM, EEPROM, a PCMCIA card, flash memory, magnetic storage, opto-magnetic storage, or any suitable selection and/or array of volatile or non-volatile memory that retains data after power to information handling system 102 is turned off.

An information handling resource 106 may include any component system, device or apparatus of information handling system 102 that may communicate with processor 103, memory 104, and/or one or more other information handling resources via one or more busses 108. For example, an information handling resource may include service processors, BIOSs, an I/O device, a storage resource, a network interface, or any other suitable component. As shown in FIG. 1, an information handling resource 106 may include a de-skew module 110. A de-skew module 110 may comprise any system, device, or apparatus configured to, in concert with a corresponding de-skew module 110 of another information handling resource 106, determine and compensate for an in-pair skew for a differential signal pair communicating a signal between the information handling resources 106, as described in greater detail in this disclosure.

As shown in FIG. 1, information handling resources 106 may be communicatively coupled via a point-to-point connection 112. Point-to-point connection 112 may comprise any system, device, or apparatus configured to transfer data between information handling resources 106.

Bus 108 may comprise any system, device, or apparatus configured to transfer data between information handling resources 106 and processor 103. For example, bus 108 may include a serial advanced technology attachment (SATA) bus, a Peripheral Component Interconnect (PCI) bus, Universal Serial Bus (USB), a Small Computer System Interface (SCSI) bus, a serial attached SCSI (SAS) bus, FireWire (IEEE 1394) bus, InfiniBand bus, or any other suitable bus.

FIG. 2 illustrates a flow chart of an example method 200 for in-pair skew determination and compensation, in accordance with embodiments of the present disclosure. According to one embodiment, method 200 may begin at step 202. As noted above, teachings of the present disclosure may be implemented in a variety of configurations of information handling system 102. As such, the preferred initialization point for method 200 and the order of the steps comprising method 200 may depend on the implementation chosen.

At step 202, a de-skew module 110 of an information handling resource 106 may initialize calibration values for in-pair skew determination and compensation. Such calibration values may comprise, for example, a maximum electrical eye size, an optimum inserted delay, and/or one or more other variables.

At step 204, a source information handling resource 106 may transmit a differential test signal pattern to a target information handling resource 106 (e.g., via a point-to-point connection 112) on a path comprising a differential pair.

At step 206, de-skew module 110 of target information handling resource 106 may receive the differential test signal pattern, and based on an analysis of the test signal pattern, estimate an eye size for an eye pattern of the differential test signal pattern as received by the target information handling resource 106. The estimated eye size may be determined in accordance with one or more numerous methods for determining an eye size, as may now or in the future be known in the relevant art.

To illustrate the concept of an "eye pattern," reference is made to FIG. 3, which illustrates an example plot of signal amplitude versus time n for a differential signal pair, in accordance with embodiments of the present disclosure. Generally speaking, an eye pattern, also known as an eye diagram, is an oscilloscope display in which a differential digital data signal at a receiver is repetitively sampled and applied to the vertical axis, while the data rate is used to trigger the horizontal sweep. It is so called because the pattern looks like a series of eyes. Several system performance measures can be derived by analyzing the eye pattern. If the signals are too long, too short, poorly synchronized with the system clock, too high, too low, too noisy, or too slow to change, or have too much undershoot or overshoot, this can be observed from the eye pattern. An open eye pattern corresponds to minimal signal distortion. Distortion of the signal waveform due to intersymbol interference, noise, in-pair skew, and other factors may appear as closure of the eye pattern.

As used in this disclosure, the term "eye size" includes the eye opening of an eye pattern or the eye width of an eye pattern. The eye opening is the peak-to-peak height of an eye pattern on the vertical axis, while the eye width is the width of the eye pattern on the horizontal axis.

Turning back to FIG. 2, at step 208, de-skew module 110 of target information handling resource 106 may store (e.g., on computer-readable media integral to or otherwise accessible to de-skew module 110) the estimated eye size as the maximum estimated eye size.

At step 210, de-skew module 110 of source information handling resource 106 may insert a positive delay of the positive polarity of the differential pair relative to the negative polarity of the differential pair. During the first execution of step 210, the inserted positive delay may be slightly greater than zero, and then may be increased each time step 210 executes. In some embodiments, the inserted delay may be increased by a particular interval for each successive execution of step 210. In such embodiments, such interval may be user-defined (e.g., by an end user or administrator of information handling system 102).

At step 212, source information handling resource 106 may re-transmit the differential test signal pattern to the target information handling resource 106 on the same path, delaying the positive polarity of the differential test signal pattern by the inserted delay.

At step 214, de-skew module 110 of target information handling resource 106 may receive the differential test signal pattern, and based on an analysis of the test signal pattern, estimate an eye size for an eye pattern of the differential test signal pattern as received by the target information handling resource 106.

At step 216, de-skew module 110 of target information handling resource 106 may determine whether the estimated eye size is greater than the previously-stored maximum estimated eye size. If the estimated eye size is greater than the previously-stored maximum estimated eye size, method 200 may proceed to step 218. Otherwise, method 200 may proceed to step 220.

At step 218, in response to a determination that the estimated eye size is greater than the previously-stored maximum estimated eye size, de-skew module 110 of target information handling resource 106 may store the estimated eye size as the maximum estimated eye size. After completion of step 218, method 200 may proceed again to step 210.

At step 220, de-skew module 110 of target information handling resource 106 may store (e.g., on computer-readable media integral to or otherwise accessible to de-skew module 110) the value of the inserted delay as the optimum inserted delay.

At step 222, de-skew module 110 of source information handling resource 106 may insert a negative delay of the positive polarity of the differential pair relative to the negative polarity of the differential pair. During the first execution of step 222, the inserted negative delay may be of magnitude slightly greater than zero, and then may be increased in magnitude each time step 222 executes. In some embodiments, the magnitude of the inserted delay may be increased by a particular interval for each successive execution of step 222. In such embodiments, such interval may be user-defined (e.g., by an end user or administrator of information handling system 102).

At step 224, source information handling resource 106 may re-transmit the differential test signal pattern to the target information handling resource 106 on the same path, delaying (in this case, advancing due to the negative delay) the positive polarity of the differential test signal pattern by the inserted delay.

At step 226, de-skew module 110 of target information handling resource 106 may receive the differential test signal pattern, and based on an analysis of the test signal pattern, estimate an eye size for an eye pattern of the differential test signal pattern as received by the target information handling resource 106.

At step 228, de-skew module 110 of target information handling resource 106 may determine whether the estimated eye size is greater than the previously-stored maximum estimated eye size. If the estimated eye size is greater than the previously-stored maximum estimated eye size, method 200 may proceed to step 230. Otherwise, method 200 may proceed to step 232.

At step 230, in response to a determination that the estimated eye size is greater than the previously-stored maximum estimated eye size, de-skew module 110 of target information handling resource 106 may store the estimated eye size as the maximum estimated eye size. After completion of step 230, method 200 may proceed again to step 220.

At step 232, target information handling resource 106 may communicate the value of the optimum inserted delay (i.e., the inserted delay leading to the maximum eye size) to the source information handling resource. After completion of step 232, method 200 may end.

Although FIG. 2 discloses a particular number of steps to be taken with respect to method 200, method 200 may be executed with greater or fewer steps than those depicted in FIG. 2. In addition, although FIG. 2 discloses a certain order of steps to be taken with respect to method 200, the steps comprising method 200 may be completed in any suitable order.

Method 200 may be implemented using information handling system 102 or any other system operable to implement method 200. In certain embodiments, method 200 may be implemented partially or fully in software and/or firmware embodied in computer-readable media.

Once the optimum inserted delay is communicated to target information handling resource 106, as described above, target information handling resource 106 may be configured to transmit data over the differential pair by inserting the optimum inserted delay into the positive polarity of the differential signal communicated over the differential pair. Thus, in accordance with the systems and methods described above, de-skew modules 110 of each of a source information handling resource 106 and a target information handling resource 106 may operate in concert to iterate among one or more positive delays and one or more negative delays for the positive polarity of a differential signal relative to its corresponding negative polarity to determine which of such delays leads to optimal differential signal quality at the receiving target information handling resource.

In some embodiments, method 200 may take place during or after auto negotiation or link training between source information handling resource 106 and target information handling resource 106. In these and other embodiments, method 200 may take place before back channel analysis training between source information handling resource 106 and target information handling resource 106.

In addition, although each of a source information handling resource 106 and a target information handling resource 106 are described above as performing particular steps of method 200, it is understood that many of the steps of method 200 may be performed by either of a source information handling resource 106 or a target information handling resource 106.

Although the present disclosure has been described in detail, it should be understood that various changes, substitutions, and alterations can be made hereto without departing from the spirit and the scope of the disclosure as defined by the appended claims.

What is claimed is:

1. An information handling system comprising:
   a processor;
   a first information handling resource communicatively coupled to the processor;
   a second information handling resource communicatively coupled to the processor; and
   de-skew resources configured to perform operations, comprising:
      determining a maximum estimated eye size for a differential signal transmitted, via a path comprising a differential pair, from the first information handling resource to the second information handling resource, wherein the maximum eye size is associated with an estimated optimum delay inserted into one component of the different signal;
      inserting differential signal delay into one component of the differential signal at the first information handling resource and determining a differential signal eye size corresponding to the differential signal delay;
      inserting differential signal delay into one component of the differential signal at the first information handling resource and determining a differential signal eye size corresponding to the differential signal delay;
      responsive to detecting the differential signal eye size exceeding the maximum estimated eye size, storing the differential signal delay as the estimated optimum delay; and
      inserting, at the first information handling resource, a particular delay, equal to the estimated optimum delay, into one of opposite polarity components prior to transmitting data from the first information handling resource.

2. The information handling system of claim 1, wherein determining differential signal eye size comprises:
   iteratively transmitting a plurality of differential test signals via the path and incrementing, at each iteration, a magnitude of a delay between the opposite polarity components; and
   for each of a plurality of delays corresponding to the plurality of differential test signals, determining an eye size of the differential test signal received at the second information handling resource.

3. The information handling system of claim 2, wherein the differential signal eye size corresponds to the differential test signal with a largest eye opening.

4. The information handling system of claim 2, wherein the differential signal eye size corresponds to the differential test signal with a largest eye width.

5. A method comprising:
   determining a maximum estimated eye size for a differential signal transmitted, via a path comprising a differential pair, from a first information handling resource to a second information handling resource, wherein the maximum eye size is associated with an estimated optimum delay inserted into one component of the different signal;
   inserting differential signal delay into one component of the differential signal at the first information handling resource and determining a differential signal eye size corresponding to the differential signal delay;
   inserting differential signal delay into one component of the differential signal at the first information handling resource and determining a differential signal eye size corresponding to the differential signal delay;
   responsive to detecting the differential signal eye size exceeding the maximum estimated eye size, storing the differential signal delay as the estimated optimum delay; and
   inserting, at the first information handling resource, a particular delay, equal to the estimated optimum delay, into one of opposite polarity components prior to transmitting data from the first information handling resource.

6. The method of claim 5, wherein determining the differential signal eye size comprises:
   iteratively transmitting a plurality of differential test signals via the path and incrementing, at each iteration, a magnitude of a delay between the opposite polarity components;
   for each of a plurality of delays corresponding to the plurality of differential test signals, determining an eye size of the differential test signal received at the second information handling resource.

7. The method of claim 6, wherein the differential signal eye size corresponds to the differential test signal with a largest eye opening.

8. The method of claim 6, wherein the differential signal eye size corresponds to the differential test signal with a largest eye width.

9. The method of claim 6, wherein incrementing at each iteration, the magnitude of the delay comprises incrementing the magnitude by a constant delay and wherein the constant delay value comprises a user selected constant delay value.

10. An article of manufacture comprising:
    a non-transitory computer readable medium; and
    computer-executable instructions carried on the computer readable medium, the instructions readable by one or more processors, the instructions, when read and executed, for causing the one or more processors to perform operations comprising:

determining a maximum estimated eye size for a differential signal transmitted, via a path comprising a differential pair, from a first information handling resource to a second information handling resource, wherein the maximum eye size is associated with an estimated optimum delay inserted into one component of the different signal;

inserting differential signal delay into one component of the differential signal at the first information handling resource and determining a differential signal eye size corresponding to the differential signal delay;

inserting differential signal delay into one component of the differential signal at the first information handling resource and determining a differential signal eye size corresponding to the differential signal delay;

responsive to detecting the differential signal eye size exceeding the maximum estimated eye size, storing the differential signal delay as the estimated optimum delay; and inserting, at the first information handling resource, a particular delay, equal to the estimated optimum delay, into one of opposite polarity components prior to transmitting data from the first information handling resource.

11. The article of manufacture of claim 10, wherein determining the differential signal eye size comprises:
iteratively transmitting a plurality of differential test signals via the path and incrementing, at each iteration, a magnitude of a delay between the opposite polarity components;
for each of a plurality of delays corresponding to the plurality of differential test signals, determining an eye size of the differential test signal received at the second information handling resource.

12. The article of manufacture of claim 11, wherein the eye size is based on at least an eye opening.

13. The article of manufacture of claim 11, wherein the eye size is based on at least one an eye width.

14. The article of manufacture of claim 11, wherein incrementing at each iteration, the magnitude of the delay comprises incrementing the magnitude by a constant delay and wherein the constant delay value comprises a user selected constant delay value.

* * * * *